US012808042B2

(12) United States Patent
Nilsson et al.

(10) Patent No.: US 12,808,042 B2
(45) Date of Patent: Nov. 24, 2026

(54) DEVICE AND METHOD TO ACHIEVE HOMOGENEOUS GROWTH AND DOPING OF SEMICONDUCTOR WAFERS WITH A DIAMETER GREATER THAN 100 MM

(71) Applicant: VEECO INSTRUMENTS INC., Plainview, NY (US)

(72) Inventors: Roger Nilsson, Lund (SE); Richard Spengler, Lund (SE)

(73) Assignee: VEECO INSTRUMENTS INC., Plainview, NY (US)

( * ) Notice: Subject to any disclaimer, the term of this patent is extended or adjusted under 35 U.S.C. 154(b) by 617 days.

(21) Appl. No.: 18/015,058

(22) PCT Filed: Jul. 10, 2021

(86) PCT No.: PCT/SE2021/050719

§ 371 (c)(1),
(2) Date: Jan. 7, 2023

(87) PCT Pub. No.: WO2022/015225

PCT Pub. Date: Jan. 20, 2022

(65) Prior Publication Data

US 2023/0257876 A1 Aug. 17, 2023

(30) Foreign Application Priority Data

Jul. 13, 2020 (SE) .................................... 2030227-9

(51) Int. Cl.
*C23C 16/44* (2006.01)
*C23C 16/455* (2006.01)
(Continued)

(52) U.S. Cl.
CPC .... *C23C 16/4412* (2013.01); *C23C 16/45504* (2013.01); *C23C 16/45574* (2013.01); *C23C 16/4584* (2013.01); *C23C 16/52* (2013.01)

(58) Field of Classification Search
CPC .......... C23C 16/4412; C23C 16/45504; C23C 16/45574; C23C 16/4584; C23C 16/52; C23C 16/45563; H01L 21/02271
See application file for complete search history.

(56) References Cited

U.S. PATENT DOCUMENTS 5,269,847 A * 12/1993 Anderson ............. C23C 16/455 118/724
5,455,070 A * 10/1995 Anderson ............. C23C 16/455 438/758
(Continued)

FOREIGN PATENT DOCUMENTS

CN 104822866 B * 9/2017 ............. B23P 19/04
EP 0606737 A1 * 7/1994
(Continued)

OTHER PUBLICATIONS

International Search Report from corresponding International Application No. PCT/SE2021/050719, mailed on Sep. 23, 2021, 4 pages.

*Primary Examiner* — Jeffrie R Lund
(74) *Attorney, Agent, or Firm* — Leason Ellis LLP

(57) ABSTRACT

Device for achieving homogeneous thickness growth and doping on a semiconductor wafer (2) with a diameter greater than 100 mm during growth at elevated temperature in a growth chamber arranged in a reactor housing comprising a growth chamber (14) with a wafer (2) on a rotating susceptor (3), where the growth chamber (14) has, an inlet channel (17) for the supply of process gases and an outlet channel (18) for discharge of unused process gases to create a process gas flow over the semiconductor wafer (2), and an injector (4) at the end of the inlet channel (17) where it opens into the growth chamber (14), where the injector (4) is divided into at least 3 gas ducts with a first gas duct B and at each side of it a second gas channel A and a third gas channel C, and where the magnitude of the gas flow in the
(Continued)

gas duct B and gas concentrations in the gas duct B are arranged to be controlled independent of gas flows and gas concentrations in gas channels A and C.

15 Claims, 2 Drawing Sheets

(51) Int. Cl.
*C23C 16/458* (2006.01)
*C23C 16/52* (2006.01)

(56) References Cited

U.S. PATENT DOCUMENTS

| | | | |
|---|---|---|---|
| 2002/0173164 A1 | 11/2002 | Raffin et al. | |
| 2008/0314311 A1 | 12/2008 | Burrows et al. | |
| 2013/0098455 A1 | 4/2013 | Ng et al. | |
| 2016/0068956 A1 | 3/2016 | Lau et al. | |
| 2017/0011904 A1 | 1/2017 | Cho et al. | |
| 2018/0258534 A1 | 9/2018 | Ji et al. | |
| 2023/0257876 A1* | 8/2023 | Nilsson | C23C 16/45574 118/730 |

FOREIGN PATENT DOCUMENTS

| | | | |
|---|---|---|---|
| JP | H05291151 A | * | 11/1993 |
| JP | 2007324286 A | | 12/2007 |
| WO | 2004109761 A2 | | 12/2004 |
| WO | 2014083400 A1 | | 6/2014 |

* cited by examiner

DEVICE AND METHOD TO ACHIEVE HOMOGENEOUS GROWTH AND DOPING OF SEMICONDUCTOR WAFERS WITH A DIAMETER GREATER THAN 100 MM

BACKGROUND/SUMMARY

Device and method to achieve homogeneous growth and doping in semiconductor wafers with a diameter greater than 100 mm

TECHNICAL FIELD

The present invention relates to an apparatus and a method which during growth of a larger wafer of a semiconductor material in a growth chamber at high temperature ensures that thickness and doping are formed homogeneously over the entire surface of the wafer.

STATE OF THE ART

In the manufacture of semiconductor materials by Chemical Vapour Deposition (CVD) it is important that the material acquires homogeneous properties. The properties obtained depend on different conditions during the manufacturing process, often called the growth of the material.

A wafer grown by CVD is usually arranged on a base plate (susceptor) made of a solid material, for example graphite, where the base plate is usually being rotated in a reactor chamber. Growth occurs at an elevated temperature in a growth chamber. When growing larger wafers, where the diameter of the wafer is greater than 100 mm, it is common for the thickness of the resulting epitaxial layer in the wafer to vary radially outwards from the center of the wafer. Furthermore, the doping varies radially outwards from the center of the wafer.

Gases, including those gases that contain the elements needed for growth, ie. for the creation of the crystal structure sought in the wafer's semiconductor material, are introduced into the chamber in a controlled manner via an injector. As mentioned, the wafer is usually rotated during growth to even out differences in the degree of growth between different portions of the wafer. The growth is e.g. usually lower downstream of the gas flow over the surface of the wafer. Thickness and doping during growth hereby vary radially due to the rotation of the wafer. This is an inconvenience that is difficult to deal with. In addition, the degree of doping and thickness do not vary analogously with each other. Thickness and doping during growth are functions of gas concentrations, temperature, velocity of gas flow, etc.

The patent specification 20130098455 is assumed to constitute prior art in the technical field. This specification mentions something about the problem of achieving uniform thickness over a Group III nitride film during growth, where this film may be semiconductor materials such as GaN, AlN and AlGaN. In said specification, the solution is proposed to be based on using several injectors for a growth chamber from more than one side wall of the growth chamber. It is unlikely that said measures simultaneously solve both the problems of varying thickness and of doping of the film.

DESCRIPTION OF THE INVENTION

According to one aspect of the invention, it is a device for achieving homogeneous growth and doping of a semiconductor wafer with a diameter greater than 100 mm during a growth at an elevated temperature in a growth chamber arranged in a reactor housing, the device having a growth chamber having a port for allowing insertion of at least one wafer on a rotating susceptor in the growth chamber and for withdrawing the wafer therefrom, the growth chamber further having an inlet channel for supplying process gases and an outlet channel for a discharge of unused process gases to create a process gas flow across the semiconductor wafer between said channels. Furthermore, the device at the end of the inlet channel, where it opens into the growth chamber, is provided with an injector for creating a laminar flow of the process gases in the growth chamber.

The injector is divided into at least 3 gas ducts with a first gas duct B and at each side thereof a second gas duct A and a third gas duct C.

The gas ducts A and C have the same cross-sectional area and usually during growth of a wafer the same gas flow and gas concentrations.

The magnitude of the gas flow in the gas duct B and gas concentrations in the gas duct B are arranged to be controlled independently of gas flows and gas concentrations in the gas ducts A and C. Gas flows and gas concentrations in the gas ducts A and C are usually set to the same values but can of course also be controlled separately to different values of flows and concentrations of gas components.

The three gas ducts A, B and C are located in the same plane.

The gas ducts A, B and C are arranged to run parallel to each other.

In analysis of previous growths of the current type of semiconductor wafers, it is ascertained that the thickness and the doping vary in a clarified manner radially over the surface of the wafer. By knowing that the thickness is too low at the edge of the wafer, the concentration of the gases that contain the elements needed for the growth in the gas ducts A and C, ie. in the side ducts, are increased, whereby the growth rate in the radially outer regions of the wafer is enhanced. By this is meant that the gas concentration of active gases (precursors) is increased in relation to the concentration of corresponding active gases in the middle duct B. As a result, the thickness of the wafer grows faster in peripheral areas of the wafer when using the device according to the invention compared to utilizing an injector according to prior art where gas flow is introduced into the growth chamber with only one gas duct or with gas ducts where flows and concentrations of the process gas cannot be varied via separated gas ducts.

When in previous growths it is known that the doping is too low at the edge of the wafer, ie. the outer regions of the wafer, the concentration of gases containing elements which leads to doping in the gas channels A and C, ie. in the side channels, whereby the doping is elevated in the radially outer areas of the wafer. This refers to the gas concentration of dopants are increased in relation to the concentration of corresponding dopants in the central channel B. As a result, the doping of the wafer increases more rapidly in edge areas of the wafer at use of the device according to the invention compared to the use of an injector according to prior art, where gas flow is introduced into the growth chamber with only one gas channel or with gas channels where flows and concentrations of gas components of the process gas cannot be varied via separated gas ducts.

The area of the wafer affected by use of the device according to the invention is controlled by a change in the relationship between the gas flow in the gas duct B and the gas flow in the gas ducts A and C. If the gas flow in the side ducts A and C is increased in relation to the gas flow in the central gas duct B, a wider part of the radially outer area is affected, i.e. along the circular edge of the wafer.

The solution described according to the invention is intended for use in growing semiconductors with a large band gap (Wide Band Gap), for example silicon carbide (SiC) and various types of nitrides, such as gallium nitride (GaN), but the solution is general and may as well be used in growths of wafers of other types.

The reactor used according to the invention is a so-called "hot wall reactor", but even in this case the solution according to the invention is general and can be used with other types of reactors. As an example, it can be stated that even cold-walled reactors have the same problems as those which are solved according to the invention. The actual temperatures in reactors used in the invention range from 700° C. to 1800° C. The lower temperature range of this interval is used in growths of nitrides.

Gases used as carrier gases in reactors according to the invention are hydrogen and nitrogen. These gases have high flows and transport the active gases (precursors), used for the growth of a specific semiconductor, at high speed through the reactor. The carrier gases have a certain impact on the chemical reactions that take place in the reactor, but they are not included in the semiconductor layers that are grown. The active gases in the growth of silicon carbide are, for example, propane, C3H8, and silane, SiH4. In the growth of gallium nitride, it is ammonia, NH3, and trimethylgallium (TMG) that constitute precursors. TMG is a liquid that is transported by means of the gas flow through the reactor by a part of this gas flow bubbling through the liquid. In the present document, the term process gas is used as a summary term for the gases flowing through the reactor, ie. carrier gas and active gases (precursors).

In principle, it is the same gas mixture in the different gas ducts A, B, C according to the invention, but the gases in the different gas ducts A, B, C can have different concentrations of the gases that make up the gas mixture in the respective gas duct. It is a basic idea according to the invention that gas concentrations in different gas ducts can be varied. As mentioned, a higher concentration of doping gas in the outer ducts A and C yields a higher doping in the peripheral area of the wafer.

The relative gas flow between the different gas ducts A, B, C can also be varied. If more gas is flowed through the side ducts A and C in relation to the gas flow in the middle duct B, then a larger part of the wafer will be affected by the specific gas flow and the gas mixture originating from the side ducts. Influence then always takes place from the edge but in such a case extends closer to the center of the wafer.

It can also be emphasized here that around the growth chamber itself gas is flushed with a purge, said purge gas being an inert gas in connection with the process, so that residual products present in the gas phase are flushed away and do not cause parasitic deposits.

DESCRIPTION

DESCRIPTION OF EMBODIMENTS

In the following, a number of embodiments of the invention are described with reference to the accompanying drawings. The drawings show only schematically the principle of the device and do not claim to show to any scale any proportions between different elements thereof.

An embodiment of a device according to the invention is presented here. By adapting the elements shown in the present described embodiment to other designs of reactors, the principle of the invention can be transferred to them.

Figure 3:
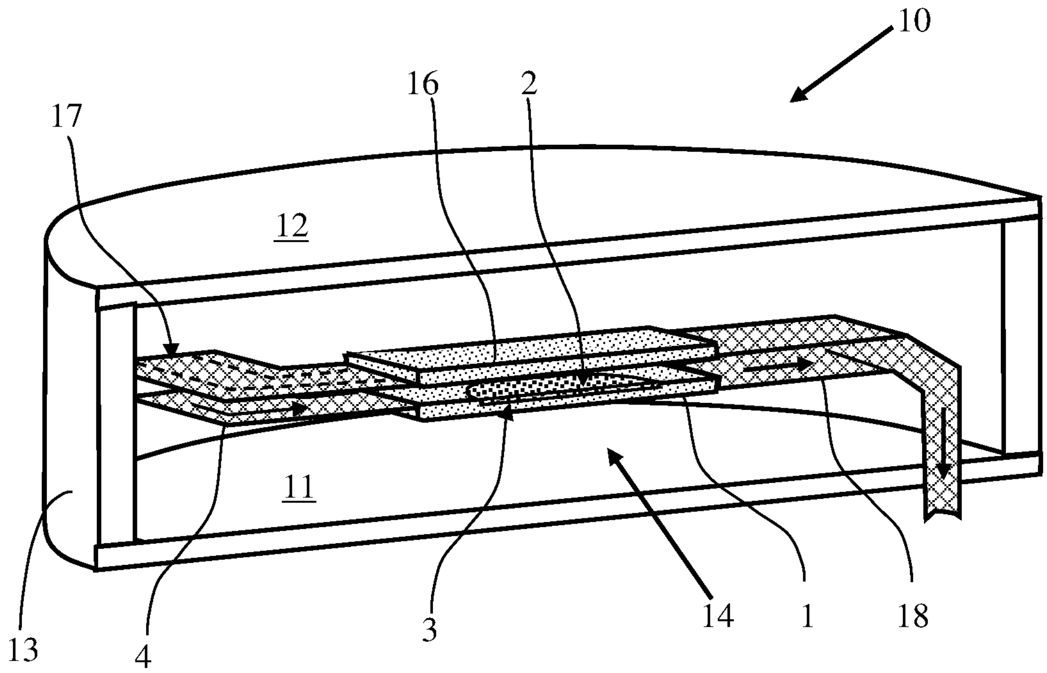
FIG. 3 shows an example of a reactor of the type used according to the invention.

The device according to the invention is shown, very schematically, inside a reactor 10 in FIG. 3, where the reactor is designed with a cylindrical housing formed with a reactor bottom 11, lid 12 and cylindrical wall 13. A reactor according to FIG. 3 is usually designed in stainless steel. The figure shows a cross-section through the reactor 10, whereby a growth chamber 14 opens inside the reactor, which is opened in a longitudinal cross-section. The growth chamber is made of a very heat-resistant material. The growth chamber 14 is seen here with a bottom 1 and an upper wall 16. A susceptor 3 is shown immersed in the bottom 1 of the growth chamber, where it is rotatably arranged in the same plane as this. The reactor 10 has a port for supplying process gases, which are introduced into the growth chamber 14 via an inlet channel 17 which at its outlet to the growth chamber 14 has an injector 4, where the process gases are symbolized by an arrow in the injector 4. Furthermore, the reactor 10 has a port for discharge of unused process gases, where these are discharged via an outlet channel 18 from the growth chamber 14. In this outlet channel 18, this flow of unused process gases is shown by means of an arrow inside the outlet channel 18.

Figure 1:
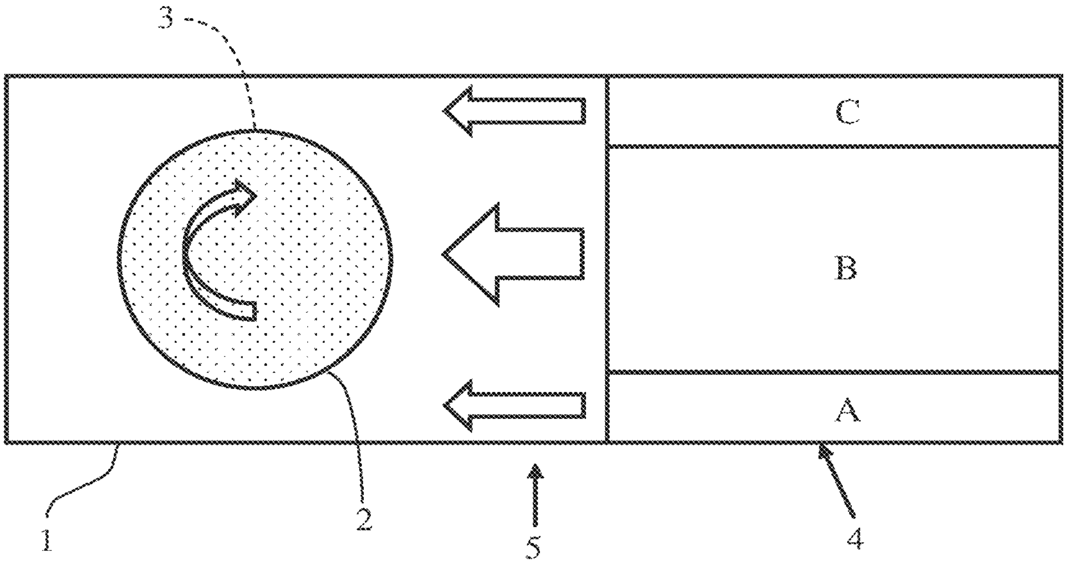
FIG. 1 schematically shows a principal diagram of the device according to the aspect of the invention where three gas ducts are shown in an injector in connection with a growth of a semiconductor wafer.

FIG. 1 shows a bottom 1 in a growth chamber 14 for growing semiconductor wafers. In the following, a semiconductor wafer is indicated very briefly as using only the term wafer. A wafer denoted by 2 is shown in the figure arranged on a susceptor which is rotated, whereby the wafer 2 will rotate in the growth chamber 14. In FIG. 1 the susceptor 3 is completely covered by the wafer 2. In connection with the channel to the growth chamber 14, the injector 4 for process gases is set up. The injector 4 feeds the process gases required for the intended growth into the growth chamber 14. The gases which form part of the process gas flow are of the same sort as according to the prior art in the growth of specific semiconductors.

The injector 4 is, according to the invention, divided into at least 3 gas ducts, here referred to as the gas ducts A, B and C. B is a central gas duct which has the main gas flow into the growth chamber 14. At each side of the central gas duct B are side gas ducts A and C. The side gas ducts A and C are directed towards the peripheral parts of the wafer 2 and supply process gases in a flow over the wafer. Since the wafer 2 is arranged rotating, the gas flow over the peripheral parts of the wafer is uniformly distributed over them. Arrow 5 schematically shows gas flows from the injector 4 into the growth chamber 14 in the direction of the rotating wafer 2.

Figure 2:
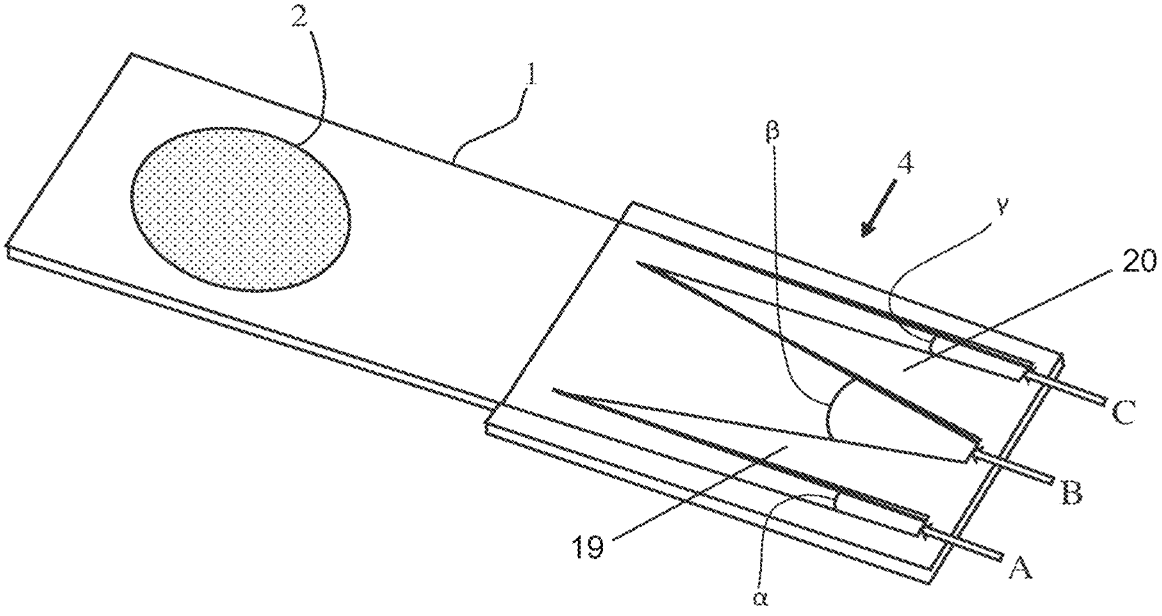
FIG. 2 illustrates a perspective view of the device according to FIG. 1 where the gas ducts are shown with a certain opening angle towards the semiconductor wafer.

As shown in FIG. 2, the gas ducts A, B and C are formed in a single injector body and are provided with opening angles $\alpha$, $\beta$, $\gamma$ towards the outlet of the injector 4. The nozzles of the injector 4 supply a laminar flow of process gases to the growth chamber 14. The opening angles in the different gas ducts A, B and C are selected so that they do not affect the laminar flow out of the injector. Suitable opening angles α, β, γ are in the range 5-30 degrees, preferably 10-30 degrees. Maximum angle depends, among other things, on gas flow, temperature, and gas. The opening angle can be selected less than 10 degrees if it is advantageous for manufacturing technical reasons. As shown in FIG. 2, the single injector body has a first angled inner partition 19 that separates the side gas duct A from the central gas duct B and a second angled inner partition 20 that separates the central gas duct B from the side gas duct C. Each of the first angled inner partition 19 and the second angled inner partition 20 has a triangular shape.

The opening angles in the outer gas ducts A and C are preferably smaller than the opening angle in the middle gas duct B.

The invention claimed is:

1. Device for achieving homogeneous thickness growth and doping in a semiconductor wafer with a diameter greater than 100 mm during growth at elevated temperature in a reactor housing, wherein the device comprises:

a growth chamber arranged in the reactor housing and having a port to allow insertion of at least one wafer on a rotating susceptor in the growth chamber and for removing the wafer therefrom, where the growth chamber further has an inlet channel for supplying process gases and an outlet channel for discharge of unused process gases to create a process gas flow over the semiconductor wafer between said channels, wherein an injector for creating a laminar flow of the process gases within the growth chamber, the injector being positioned within the reactor housing and being arranged at the end of the inlet channel where the inlet channel opens into the growth chamber, the injector comprising a single injector body that is divided into at least three gas ducts with a first gas duct and at each side thereof a second gas duct and a third gas duct, wherein the each of the first gas duct, the second gas duct and third gas duct are spaced internally from a wall of the reactor housing, the single injector body having an inlet end that is disposed internally within the reactor housing and is spaced away from and is free of contact with an outer peripheral wall of the reactor housing, the magnitude of the gas flow in the first gas duct and gas concentrations in the first gas duct are arranged to be controlled independently of gas flows and gas concentrations in the second and third gas ducts.

2. The device according to claim 1, wherein the second and third gas ducts have the same cross-sectional area and when growing a wafer the same gas flow and gas concentrations.

3. The device according to claim 1, wherein the first, second and third gas ducts are located in the same plane and are integrally formed within the single injector body.

4. The device according to claim 1, wherein the first, second and third gas ducts are arranged to run parallel to each other.

5. The device according to claim 1, wherein the first gas duct has an opening angle in the range 5-30 degrees and wherein the second and third gas ducts have opening angles in the range 5-30 degrees.

6. The device according to claim 5, wherein the opening angles of the second and third gas ducts, that are outer gas ducts relative to the first gas duct, are smaller than the opening angle of the first gas channel which is between said second and third gas ducts.

7. The device according to claim 1, wherein the first gas duct has an opening angle in the range 10-30 degrees and wherein the second and third gas ducts have opening angles in the range 10-30 degrees.

8. A method, using the device of claim 1, for achieving homogeneous thickness growth of a semiconductor wafer with a diameter greater than 100 mm during growth at elevated temperature in a growth chamber set up in a reactor housing, comprising:

increasing a concentration of active gases in the second and third gas ducts in relation to a concentration of the active gases in the first gas duct to achieve increased thickness growth of the wafer in its peripheral areas.

9. A method according to claim 8, wherein:

a radially wider part of the outer areas of the wafer is affected by the gas flow via the second and third gas ducts by an increase of the gas flow in the second and third gas ducts relative to the gas flow in the first gas duct.

10. A method, using the device of claim 1, for achieving homogeneous doping in a semiconductor wafer with a diameter greater than 100 mm during growth at elevated temperature in a growth chamber set up in a reactor housing, comprising:

increasing a concentration of dopant gases in the second and third gas ducts in relation to a concentration of the dopant gases in the first gas duct to achieve increased doping of the wafer in its peripheral areas.

11. The device according to claim 1, wherein the single injector body has a first angled inner partition that separates the first gas duct from the second gas duct and a second angled inner partition that separates the second gas duct from the third gas duct.

12. The device according to claim 11, wherein the first angled inner partition has a first inner surface and the second angled inner partition has a second inner surface that faces the first inner surface, the second gas duct being located between the first inner surface and the second inner surface.

13. The device according to claim 12, wherein the first inner surface and the second inner surface diverge from one another in a direction toward the growth chamber.

14. A device for achieving homogeneous thickness growth and doping in a semiconductor wafer with a diameter greater than 100 mm during growth at elevated temperature in a reactor housing, comprising:

a growth chamber arranged in the reactor housing and having a port to allow insertion of at least one wafer on a rotating susceptor in the growth chamber and for removing the wafer therefrom, where the growth chamber further has an inlet channel for supplying process gases and an outlet channel for discharge of unused process gases to create a process gas flow over the semiconductor wafer between said channels, and a single injector for creating a laminar flow of the process gases within the growth chamber, the injector being positioned within the reactor housing and being arranged at the end of the inlet channel where the inlet channel opens into the growth chamber, wherein the single injector comprises a single injector body that is divided into at least three gas ducts with a first gas duct and at each side thereof a second gas duct and a third gas duct, wherein the single injector body has a first angled inner partition that separates the first gas duct from the second gas duct and a second angled inner partition that separates the second gas duct from the third gas duct, each of the first angled inner partition and the second angled inner partition having a triangular shape, the single injector body having an inlet end that is disposed internally within the reactor housing and is spaced away from and is free of contact with an outer peripheral wall of the reactor housing, wherein the magnitude of the gas flow in the first gas duct and gas concentrations in the first gas duct are arranged to be controlled independently of gas flows and gas concentrations in the second and third gas ducts, and wherein the magnitude of gas concentrations in gas concentrations in second and third gas ducts are set to yield an increased doping level in a peripheral area of the wafer;

wherein the first, second and third gas ducts are arranged parallel to one another;

wherein first gas duct has a first opening angle, the second gas duct has a second opening angle and the third gas duct has a third opening angle, wherein the first opening angle is greater than each of the second opening angle and the third opening angle, the first, second and third opening angles being selected so that they do not affect the laminar flow out of the injector;

wherein a center axis of the second gas duct is laterally offset from the rotating susceptor, and a center axis of the third gas duct is laterally offset from the rotating susceptor.

15. Device for achieving homogeneous thickness growth and doping in a semiconductor wafer with a diameter greater than 100 mm during growth at elevated temperature in a reactor housing, wherein the device comprises:

a growth chamber arranged in the reactor housing and having a port to allow insertion of at least one wafer on a rotating susceptor in the growth chamber and for removing the wafer therefrom, where the growth chamber further has an inlet channel for supplying process gases and an outlet channel for discharge of unused process gases to create a process gas flow over the semiconductor wafer between said channels, wherein an injector for creating a laminar flow of the process gases within the growth chamber, the injector being positioned within the reactor housing and being arranged at the end of the inlet channel where the inlet channel opens into the growth chamber, the injector comprising at least three gas ducts with a first gas duct and, at each side thereof, a second gas duct and a third gas duct, wherein the first gas duct is configured to direct process gas toward a central region of the semiconductor wafer and the second and third gas ducts are configured to direct process gas toward peripheral regions of the semiconductor wafer as a result of a center axis of the second gas duct being laterally offset from the rotating susceptor, and a center axis of the third gas duct being laterally offset from the rotating suscept, and wherein the magnitude of gas flow and gas concentrations in the second and third gas ducts are controllable relative to the magnitude of gas flow and gas concentrations in the first gas duct to compensate for radial nonuniformity in thickness growth and/or doping between the central region and the peripheral regions of the semiconductor wafer.

* * * * *